(12) United States Patent
Minier

(10) Patent No.: US 6,504,355 B2
(45) Date of Patent: Jan. 7, 2003

(54) DEVICE FOR MEASURING AN ELECTRIC CURRENT BY FARADAY EFFECT

(75) Inventor: Vincent Minier, Grenoble (FR)

(73) Assignee: Schneider Electric Industries SA (FR)

( * ) Notice: Subject to any disclaimer, the term of this patent is extended or adjusted under 35 U.S.C. 154(b) by 0 days.

(21) Appl. No.: 09/874,228

(22) Filed: Jun. 6, 2001

(65) Prior Publication Data

US 2002/0011831 A1 Jan. 31, 2002

(30) Foreign Application Priority Data

Jun. 30, 2000 (FR) .............................................. 00 08480

(51) Int. Cl.$^7$ ................................................ G01R 31/00
(52) U.S. Cl. .............................. 324/96; 324/97; 324/175
(58) Field of Search .......................... 324/96, 202, 225, 324/244.1, 71.3, 97, 175, 344, 332, 501, 702, 751; 250/225, 227.1, 227.17, 231.1; 356/365, 364; 359/281, 283

(56) References Cited

U.S. PATENT DOCUMENTS

| 4,564,754 | A | | 1/1986 | Sato et al. |
|---|---|---|---|---|
| 4,916,387 | A | * | 4/1990 | Miller .......................... 324/96 |
| 4,973,899 | A | | 11/1990 | Jones et al. |
| 5,486,754 | A | * | 1/1996 | Cruden ......................... 324/96 |
| 5,764,046 | A | * | 6/1998 | Bosselmann .................. 324/96 |
| 6,043,648 | A | * | 3/2000 | Menke ...................... 324/244.1 |

* cited by examiner

Primary Examiner—Michael Sherry
Assistant Examiner—Trung Nguyen
(74) Attorney, Agent, or Firm—Parkhurst & Wendel, L.L.P.

(57) ABSTRACT

A light beam output from a magneto-optical current transducer using the Faraday effect is divided into two output light beams. A first output light beam is applied, via an output polarizer, to a first optical input of a processing unit. A second output light beam is applied to a second optical input of the processing unit. The processing unit converts the two beams into electrical signals U1 and U2, then computes a first quantity R=U1/U2, determines the AC component ($R_{AC}$) and the DC component ($R_{DC}$) of the first quantity and deduces therefrom a second quantity $S=R_{AC}/R_{DC}$ enabling the electric current to be measured to be determined.

11 Claims, 9 Drawing Sheets

DEVICE FOR MEASURING AN ELECTRIC CURRENT BY FARADAY EFFECT

BACKGROUND OF THE INVENTION

The invention relates to a device for measuring an electric current by Faraday effect comprising:
- a light source supplying an incident light beam,
- an input polarizer to polarize the incident light beam linearly,
- a magneto-optical transducer receiving the polarized incident light beam,
- a beam separator arranged at the output of the transducer and supplying first and second output light beams,
- an output polarizer arranged on the path of the first output light beam,
- a processing unit comprising a first optical input connected to the output of the output polarizer, a second optical input receiving the second output light beam directly from the beam separator, and means for opto-electronic conversion connected to the first and second optical inputs to supply first and second electrical signals to computing means for digital computation of the current to be measured.

STATE OF THE ART

In a Faraday effect current sensor, the polarization plane of a polarized incident light undergoes a rotation which is a function of the magnetic field created by the electric current to be measured. The current to be measured can be determined by determining the angle of rotation of the polarization plane of the light on output of the optical sensor.

In the absence of specific measurements, measurement is sensitive to the optical power drifts of the sensor, to temperature variations, to vibrations of the sensor and to the optical and electronic noise in the whole of the measuring chain.

In most known Faraday effect current sensors, a polarization analyzer breaks the optical beam output from the magneto-optical transducer down into two optical components polarized linearly along orthogonal axes. These optical components are converted into electrical signals, the current to be measured being able to be determined from analysis of these signals.

The document FR-A-2,686,422 describes a sensor of this type wherein the electrical signals representative of the two optical components are processed by two distinct measuring channels before being applied to the computing means. In one of the measuring channels the electrical signals are applied to a variable gain amplifier. The sensor then computes the ratio $\Delta/\Sigma$ between the difference $\Delta=I_1-GI_2$ and the sum $\Sigma=I_1+GI_2$, wherein $I_1$ and $I_2$ are respectively representative of the intensities of the two optical components and G is the gain of the variable gain amplifier. This sensor thus enables optical drifts and the optical noise up-line from the polarization analyzer to be eliminated.

The document WO-A-9510046 describes a sensor wherein the electrical signals S1 and S2 representative of the two optical components are standardized to form a signal P=(S1−S2)/(S1+S2). The AC component PAC and DC component PDC of this signal are used to calculate a signal compensated in temperature, preferably in the form PAC/(1+KPDC), where K is a correction coefficient.

Furthermore, the article "A common-mode optical noise-rejection scheme for an extrinsic Faraday current sensor", by Fisher et al. (1996, IOP Publishing Ltd), describes an optical current sensor eliminating the common optical noise induced by the vibrations of connecting optical fibers. The optical beam output from the magneto-optical transducer is divided into two beams by a separator adjoined to the transducer. The two beams, one thereof passes through a polarizer, are guided by optical fibers to two photodiodes. The current to be measured is calculated from the difference between the electrical signals supplied by the photodiodes. This type of sensor does not enable either the differential optical noise, or the drifts, or the noise due to the electronic processing circuit to be compensated, nor does it compensate the temperature variations.

The optical sensor described in U.S. Pat. No. 5,008,611 is rendered insensitive to birefringence variations, due in particular to temperature variations, by a suitable choice of the angle made by the direction of polarization of the input polarizer with a principal axis of the magneto-optical transducer. In this document, the linearly polarized optical beam output from the transducer is not separated into two components. The current to be measured is computed from the ratio between the AC and DC components of an electrical signal representative of the intensity of the polarized output optical beam. This type of sensor remains sensitive to optical noise in the measurement passband.

OBJECT OF THE INVENTION

The object of the invention is to achieve a device for measuring an electric current by Faraday effect not presenting the shortcomings of known devices.

This object is achieved by the fact that the computing means comprise means for computing a first quantity constituted by the ratio between the first and second electrical signals, means for determining the AC and DC components of the first quantity, means for computing a second quantity from the AC and DC components of the first quantity, and means for computing the current to be measured from the second quantity.

According to a first development of the invention the second quantity is obtained by computing the ratio between the AC and DC components of the first quantity.

According to a second development of the invention the second quantity S is obtained according to the equation:

$$S = \frac{R_{AC}}{1 + a(R_{DC} - 1)}$$

wherein $R_{AC}$ and $R_{DC}$ are respectively the AC and DC components of the first quantity and a is an adjustment coefficient.

The beam separator is preferably located as close as possible to the processing unit and is connected to the transducer by a single-mode, polarization maintaining optical fiber. The influence of differential optical noises can thus be minimized.

According to another development of the invention the means for opto-electronic conversion comprise two photo-diodes formed on a single semi-conductorg substrate and associated respectively to the first and second optical inputs of the processing unit, two amplifiers formed on a single semi-conductor substrate being connected on output of the photo-diodes. The differential electronic noises and drifts are thus minimized.

According to another development of the invention, the means for opto-electronic conversion comprise first and second photodiodes connected to the first and second optical inputs of the processing unit, the processing unit comprising first and second amplifiers respectively connected to the outputs of the first and second photodiodes, means for determining the DC component of the output signals of one of said amplifiers, means for determining a first difference between the output signals of the first amplifier and of the means for determining the DC component of the output signals of one of said amplifiers, means for determining a second difference between the output signals of the second amplifier and of the means for determining the DC component of the output signals of one of said amplifiers, the outputs of the means for determining the DC component of the output signals of one of said amplifiers and of the means for determining the first and second differences being connected to inputs of an electronic digital processing circuit comprising means for reconstituting, from the signals applied to its inputs, the first and second electrical signals used by the means for computing the first quantity, the processing unit comprising amplifiers of preset gain g, connected between the means for determining the first and second differences and the associated inputs of the electronic digital processing circuit, the first and second electrical signals Ui used by the means for computing the first quantity being determined according to the equation:

$$U_i = (A_i/g) + A_3$$

with i=1, 2 and wherein A1, A2 and A3 are respectively the signals applied to the inputs of the electronic digital processing circuit.

According to another development of the invention, the means for opto-electronic conversion comprise first and second photodiodes connected to the first and second optical inputs of the processing unit, the processing unit comprising first and second amplifiers respectively connected to the outputs of the first and second photodiodes, means for determining the DC components of the output signals of said amplifiers, means for determining the AC components of the output signals of said amplifiers, the outputs of the means for determining the DC and AC components of the output signals of said amplifiers being connected to inputs of an electronic digital processing circuit comprising means for reconstituting, from the signals applied to its inputs, electrical signals used by the means for computing the first quantity, the processing unit comprising amplifiers of preset gain g, connected between the means for determining the AC components and the associated inputs of the electronic digital processing circuit, the electrical signals V1 and V2 used by the means for computing the first quantity being determined according to the equations:

$$V1 = B_1 + B_2$$
$$V2 = B_3 + B_4$$

wherein $B_1$, $B_2$, $B_3$ and $B_4$ are respectively the signals applied to the inputs of the electronic digital processing circuit.

BRIEF DESCRIPTION OF THE DRAWINGS

Other advantages and features will become more clearly apparent from the following description of particular embodiments of the invention, given as non-restrictive examples only and represented in the accompanying drawings, in which.

DETAILED DESCRIPTION OF PREFERRED EMBODIMENTS

Figure 1:
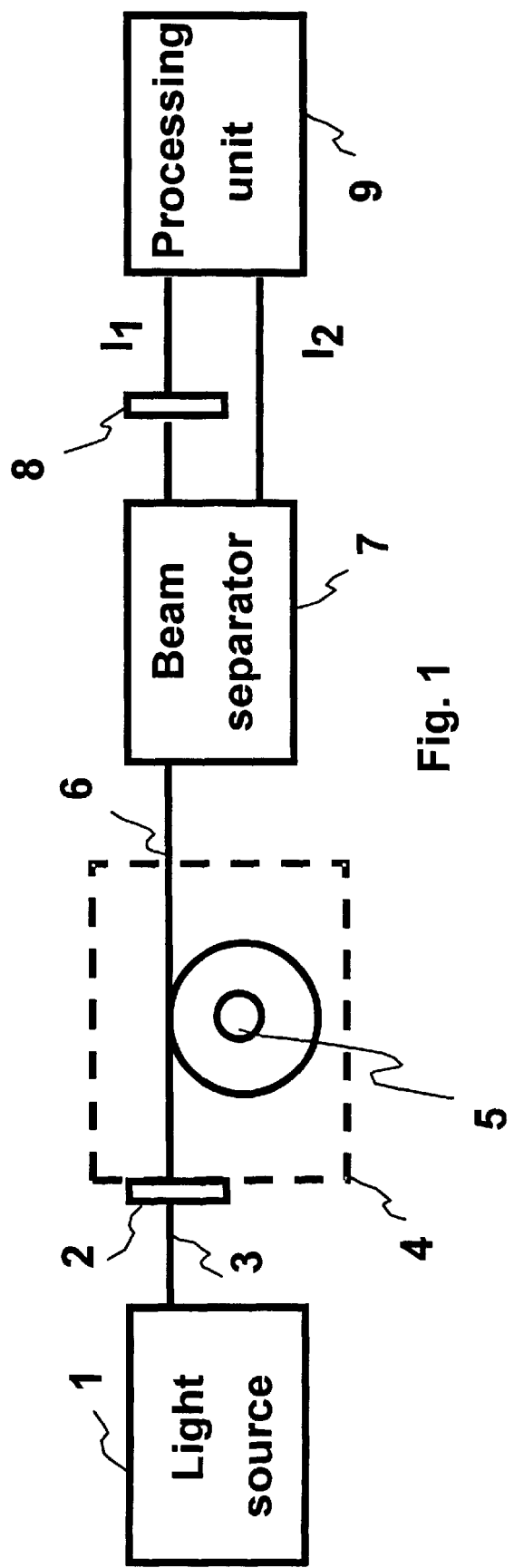
FIG. 1 represents a particular embodiment of a device according to the invention.

The device for measuring electric current by Faraday effect represented in FIG. 1 comprises, in conventional manner, a light source 1 supplying an incident light beam. The incident light beam is polarized linearly by an input polarizer 2, the beam being conducted to said polarizer by a single-mode, polarization maintaining optical fiber 3. The polarized incident light beam is applied to the input of a magneto-optical transducer 4. In the embodiment of FIG. 1, the transducer 4 is formed by an optical fiber surrounding a conductor 5 wherein the current I to be measured is flowing. The light beam obtained at the output of the transducer 4 is conducted by a single-mode, polarization maintaining optical fiber 6 to a beam separator 7 which supplies first and second output light beams respectively to two measuring channels. In the first measuring channel, an output polarizer 8 is arranged on the path of the first output light beam so as to polarize the latter linearly. The polarized first output light beam, of intensity I1, is applied to a first optical input of a processing unit 9. In the second measuring channel, the second output light beam, of intensity I2, is applied directly from the separator to a second optical input of the processing unit 9.

In conventional manner, the processing unit 9 comprises means for opto-electronic conversion comprising two photodiodes 10 respectively associated to the first and second optical inputs of the processing unit. Each of the photodiodes 10 is connected to the terminals of an associated amplifier 11. First and second electrical signals U1 and U2, respectively representative of the intensity I1 and I2 of the first and second output light beams, are thus obtained respectively on output of each of the two measuring channels.

The processing unit comprises computing means for digital computation of the current I to be measured, the first and second electrical signals U1 and U2 being applied to said means. In the particular embodiment represented in FIG. 2, the computing means comprise a circuit 12 for computing a first quantity R constituted by the ratio U1/U2 between the first and second electrical signals. It then comprises a circuit 13, for example formed by a filter, for determining the AC component $R_{AC}$ and the DC component $R_{DC}$ of the first quantity. The components $R_{AC}$ and $R_{DC}$ are applied to the input of a computing circuit 14 for computation of a second quantity S, itself applied to the input of a computing circuit 15 for computation of the current I to be measured.

Figure 2:
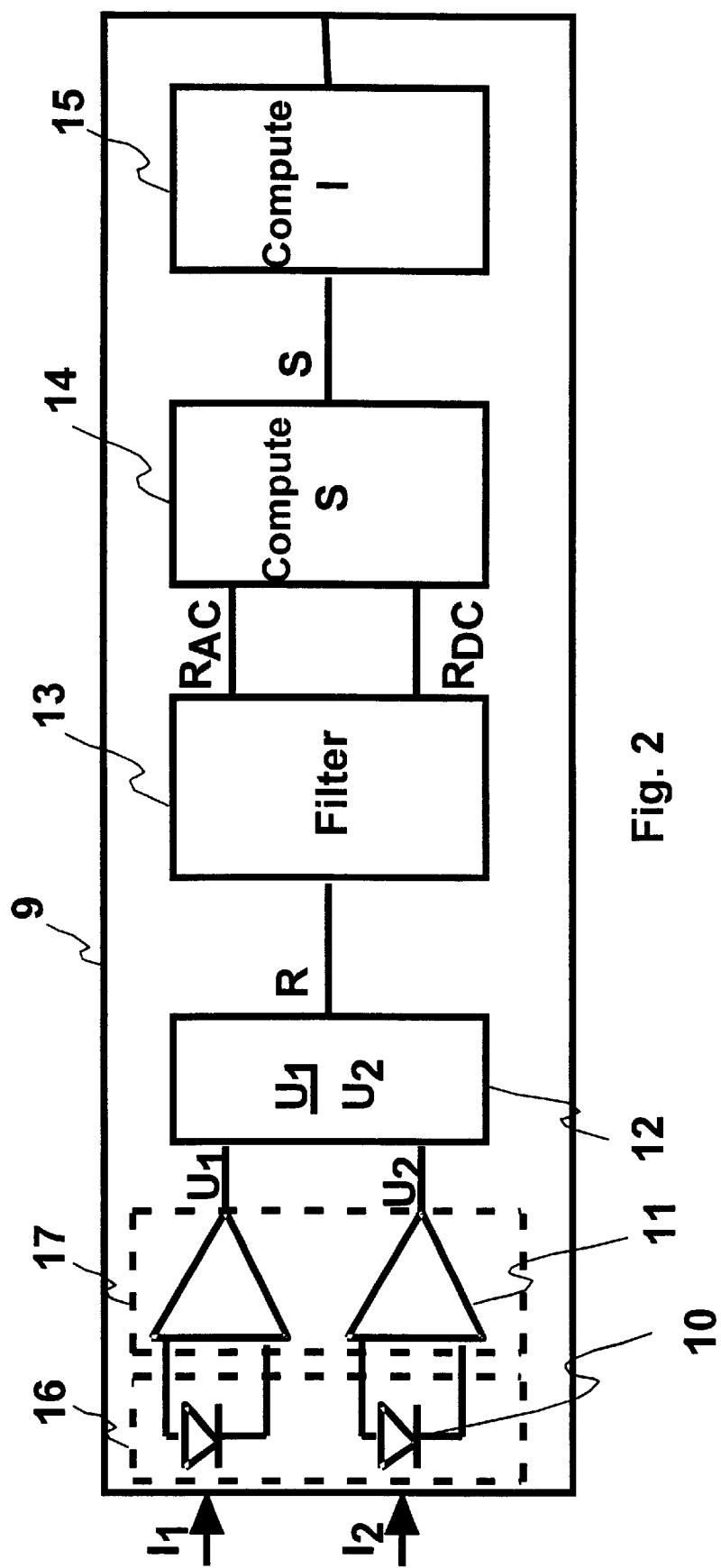
FIG. 2 represents, in greater detail, a particular embodiment of the processing unit of the device according to FIG. 1.

In FIG. 2 the circuits 12 to 15 are represented in the form of separate circuits. As the different computations are performed in digital form, they can also be performed by a microprocessor.

According to a first embodiment of the invention, the second quantity S is obtained by computing the ratio between the AC component $R_{AC}$ and the DC component $R_{DC}$ of the first quantity R:

$$S = R_{AC}/R_{DC} \qquad (1)$$

The current I to be measured, proportional to the second quantity S, can be deduced therefrom. A value of the current I to be measured is thus obtained, which value is simultaneously insensitive to optical power drifts, to drifts of the photodiodes 10 or of the amplifiers 11, and to common optical noises (up-line from the beam separator 7), in particular to those comprised within the passband of the sensor. This signal processing is moreover compatible with implementation of compensation of temperature effects on the transducer 4.

The intensities I1 and I2 of the first and second output light beam applied to the optical inputs of the processing unit can in fact be written in the form:

$$I1 = \alpha_1 I_0 (1+\beta_{Opt})(A+B2VNI) \quad (2)$$

$$I2 = \alpha_2 I_0 (1+\beta_{Opt}) \quad (3)$$

equations wherein:

- $\alpha_1$ and $\alpha_2$ respectively represent the coefficients of the insertion losses of the whole of the optical chain in the two measuring channels, up to the first and second optical inputs of the processing unit. These coefficients, which depend in particular on the temperature of the light source 1 and of the transducer 4, are representative of the optical power drifts.
- $I_0$ is the intensity of the incident light beam supplied by the light source 1.
- $\beta_{Opt}$ is representative of the optical noise in intensity, due in particular to the optical fluctuations of the signals in the passband of the device.
- A and B are constants able to vary slowly according to the temperature fluctuations of the light source and of the transducer.
- V is the Verdet's constant of the magneto-optical transducer 4.
- N is the (known) number of turns made by the light beam around the conductor 5 in the transducer 4.
- I is the intensity of the AC electric current to be measured.

Only the signal I1 contains information relative to the current to be measured, whereas the two signals I1 and I2 comprise information relative to the noise and to the optical drifts.

The signals U1 and U2 representative of I1 and I2 can be represented in the form:

$$U1 = \eta_1 G_1 I1 \quad (4)$$

$$U2 = \eta_2 G_2 I2 \quad (5)$$

where:

- $\eta_1$ and $\eta_2$ respectively represent the conversion efficiencies of the photodiodes 10 of the two measuring channels.
- $G_1$ and $G_2$ respectively represent the gains of the amplifiers 11 of the two measuring channels.

The first quantity R=U1/U2 can therefore be written:

$$R = \frac{\eta_1 G_1 \alpha_1}{\eta_2 G_2 \alpha_2}(A + B2VNI) \quad (6)$$

The AC component of the first quantity is obtained by filtering in the passband of the sensor, adapted to match the frequency of the alternating currents I to be measured and preferably comprised between 0.1 Hz and a few kHz, and can be written:

$$R_{AC} = \frac{\eta_1 G_1 \alpha_1}{\eta_2 G_2 \alpha_2} B2VNI \quad (7)$$

The DC component of the first quantity can be written:

$$R_{DC} = \frac{\eta_1 G_1 \alpha_1}{\eta_2 G_2 \alpha_2} A \quad (8)$$

From the equations (1), (7) and (8), the second quantity S is then given by:

$$S = B/A2VNI \quad (9)$$

Computation of I thus simultaneously discards the influence of the coefficients $\alpha_1, \alpha_2, \beta_{Opt}, \eta_1, \eta_2, G_1$ and $G_2$.

In a preferred embodiment, the angular positions of the input and output polarizers (2, 8) are adjusted with respect to the principal axes of birefringence of the transducer 4, in the same way as the device of U.S. Pat. No. 5,008,611. A suitable choice of these angles eliminates the influence of slow fluctuations of the transducer birefringence with temperature.

In an alternative embodiment, the second quantity S is given by the following equation:

$$S = \frac{R_{AC}}{1 + a(R_{DC} - 1)} \quad (10)$$

wherein a is an electronically adjustable adjustment coefficient. Introducing the coefficient a enables the temperature compensation to be more finely tuned and the insensitivity of the device to temperature variations to be thus improved, in the same way as for the device according to the document WO-A-9510046.

In the above equations the differential noise, both optical and electronic, between the two measuring channels has been ignored. In practice, the equations (2) and (3) should be completed according to the following equations:

$$I1 = \alpha_1 I_0(1+\beta_{Opt})(1+\beta_{1oe})(A+2VNI) \quad (11)$$

$$I2 = \alpha_2 I_0(1+\beta_{Opt})(1+\beta_{2oe}) \quad (12)$$

wherein the coefficients $\beta_{1oe}$ and $\beta_{2oe}$ are respectively representative of the differential, optical and electronic noise, on the two measuring channels.

The coefficients $\beta_{1oe}$ and $\beta_{2oe}$ are zero outside the sensor passband. The DC component of the first quantity is therefore unchanged. On the other hand, taking account of the differential noise, the equation (6) has to be replaced by the following equation:

$$R = \frac{\eta_1 G_1 \alpha_1}{\eta_2 G_2 \alpha_2} \frac{1+\beta_{1oe}}{1+\beta_{2oe}}(A + B2VNI) \quad (13)$$

To reduce the influence of the differential optical noise as far as possible, the beam separator 7 is located as close as possible to the processing unit 9, thus reducing the length of the two separate optical measuring channels. The beam separator is then connected to the transducer 4 by a single-mode, polarization maintaining optical 6 fiber which can be very long. For example purposes, the fiber 6 can have a length of several meters in an application with a current sensor in a high-voltage device.

The influence of the differential electronic noise can be reduced by a suitable choice of the photodiodes 10 and amplifiers 11 of the two measuring channels of the processing unit 9, for example by using double photodiodes 10, i.e. formed on a single semi-conductor substrate 16, and double amplifiers 11, formed on a single semi-conductor substrate 17. The substrates 16 and 17 may be formed by a single substrate. The coefficients $\beta_{1oe}$ and $\beta_{2oe}$ are then very close and the second quantity S becomes less sensitive to differential noise.

Figure 3:
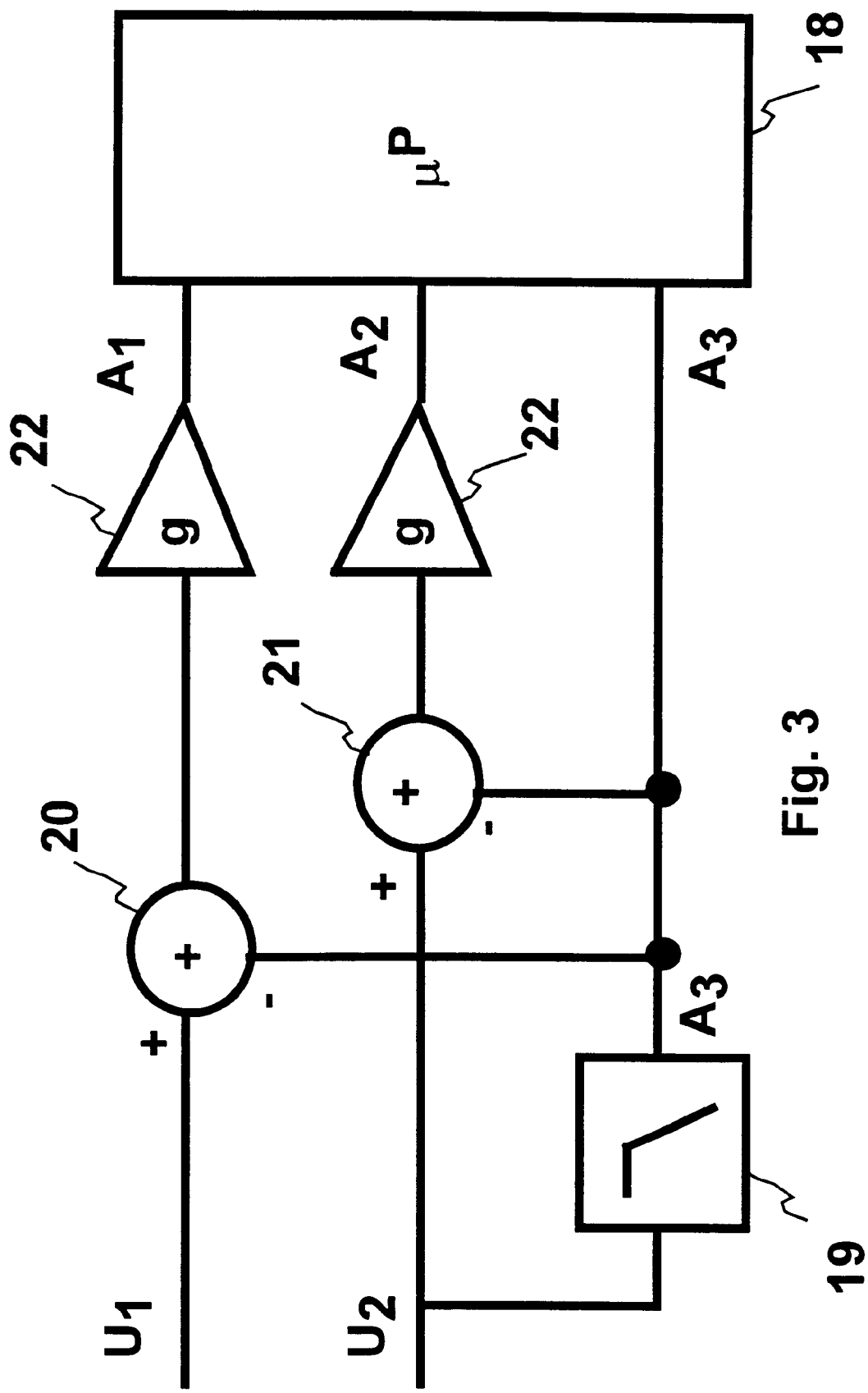
FIGS. 3 and 5 represent alternative embodiments of the processing unit of the device according to FIG. 1.

The alternative embodiment of the processing unit represented in FIG. 3 enables the limitations linked to problems of saturation of the measuring channel amplifiers to be overcome. The analog part of the measuring channels is modified to supply signals $A_1$, $A_2$ and $A_3$ to three inputs of an electronic digital processing circuit, formed by a microprocessor 18 in the particular embodiment represented in FIG. 3. The signals $A_3$ are representative of the DC component of the output electrical signals of one of the amplifiers 11 of the processing circuit. In FIG. 3, the signals $A_3$ are obtained by means of a low-pass filter 19 receiving the second electrical signals U2.

The signals U1 are applied to a first, positive, input of a first operator 20, which operator receives the signals $A_3$ on a second, negative, input so as to calculate the difference between the signals U1 and $A_3$. In like manner, a second operator 21 receives the signals U2 on a first, positive, input and the signals $A_3$ on a second, negative, input so as to calculate the difference between the signals U2 and $A_3$. The output signals of the first and second operators 20 and 21 are respectively applied to amplifiers 22, of preset gain g, supplying amplified difference signals $A_1$=g (U1–$A_3$) and $A_2$=g (U2–$A_3$) to the microprocessor 18. The signals $A_3$ are representative of the DC level of the signals U1 and U2, which is relatively high in comparison with their variations. Indeed, in the equation (2) the term A is close to 1 whereas the term B2VNI is about $10^{-5}$. Annulling the DC components of the signals U1 and U2 enables a zoom effect to be made on their variable components, which can then be amplified by the amplifiers 22 without risking saturation.

Figure 4:
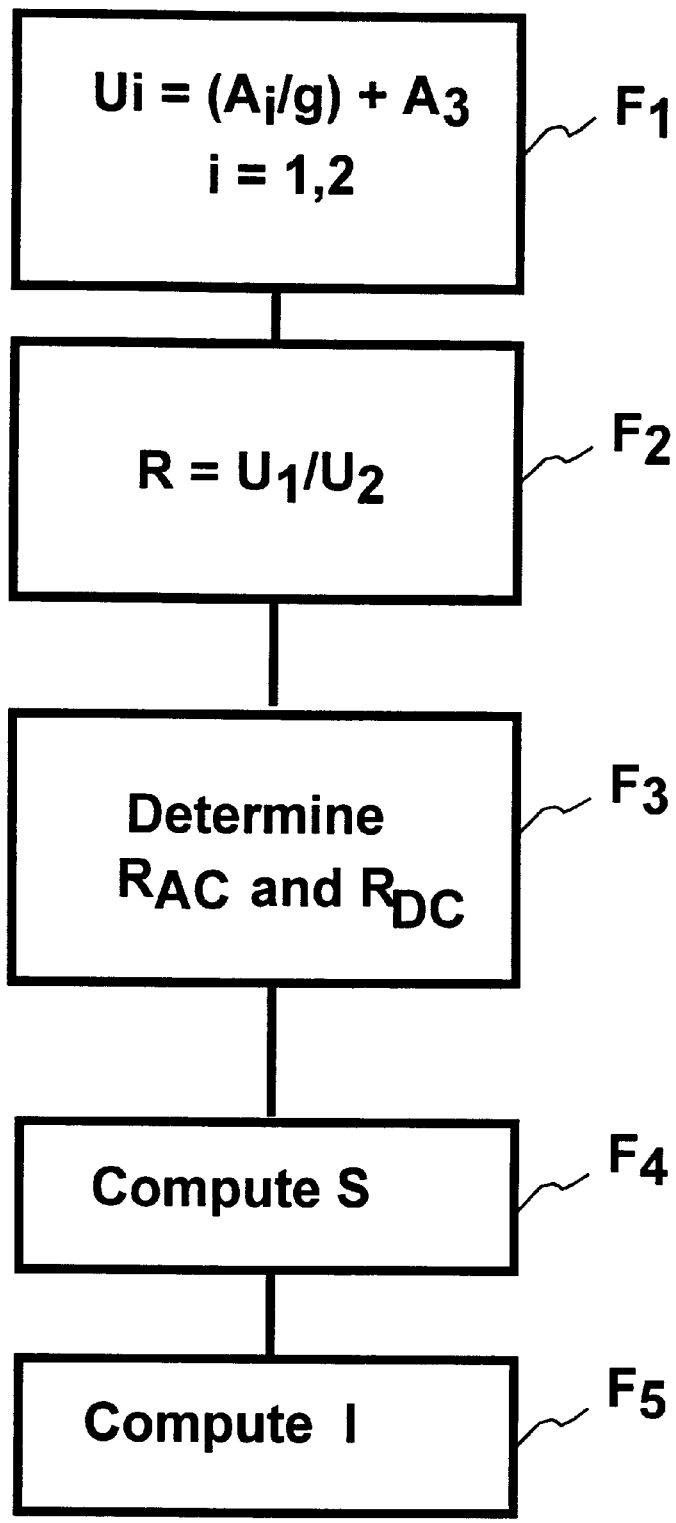
FIGS. 4 and 6 represent particular embodiments of an operation flowchart able to be used respectively by the alternative embodiments of FIGS. 3 and 5.

The microprocessor 18 then reconstitutes the signals U1 and U2 from the signals $A_1$, $A_2$ and $A_3$, and then uses these signals U1 and U2, as previously described, for computing R, S and I. For this, as illustrated by the flowchart of FIG. 4, the microprocessor 18 computes the reconstituted signals Ui, i=1, 2 in a step F1 according to the equation:

$$U i=(A_i/g)+A_3 \tag{14}$$

It can be verified that the reconstituted signals Ui are in fact equal to the output signals U1 and U2 of the amplifiers 11. Indeed, for i=1 for example:

$$(A_1/g)+A_3=[g(U-A_3)/g]+A_3=U_1 \tag{15}$$

The microprocessor 18 then computes (step F2) the first quantity R, then determines (step F3) the AC component $R_{AC}$ and DC component $R_{DC}$ of the first quantity. It then computes (step F4) the second quantity S according to the equations (1) or (10), then (step F5) the current I to be measured according to equation (9).

Figure 5:
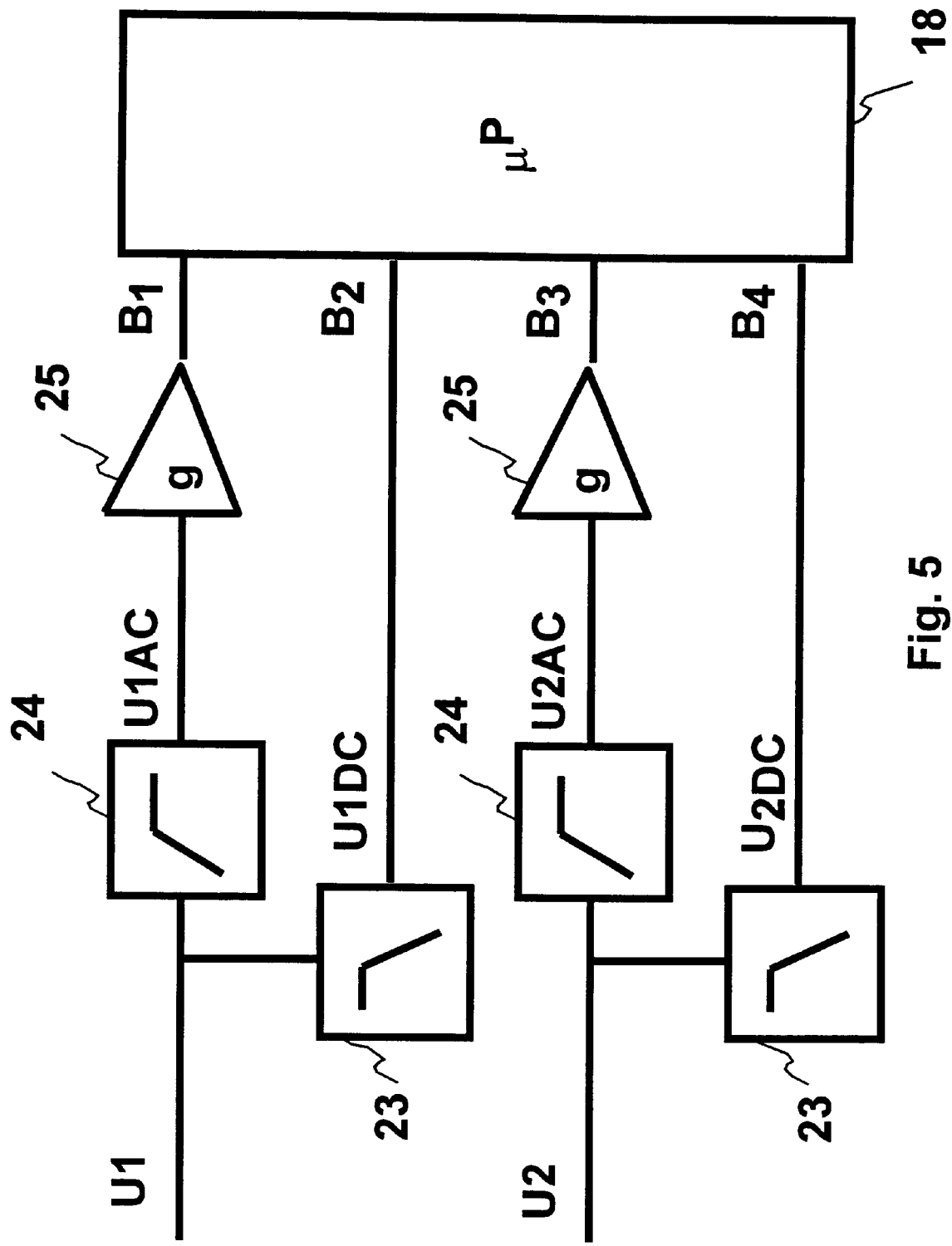

In the alternative embodiment of FIG. 5, the analog part of the measuring channels supplies signals $B_1$, $B_2$, $B_3$ and $B_4$ to four inputs of the electronic digital processing circuit formed by the microprocessor 18. The signals $B_1$ and $B_3$ are representative of the AC components U1AC and U2AC of the output signals U1 and U2 of the amplifiers 11, whereas the signals $B_2$ and $B_4$ are representative of the DC components U1DC and U2DC of the signals U1 and U2, obtained by means of low-pass filters 23. The AC components U1AC and U2AC, obtained by means of high-pass filters 24, are respectively applied to amplifiers 25, of preset gain g, supplying the signals $B_1$ and $B_3$ to the microprocessor 18.

Figure 6:
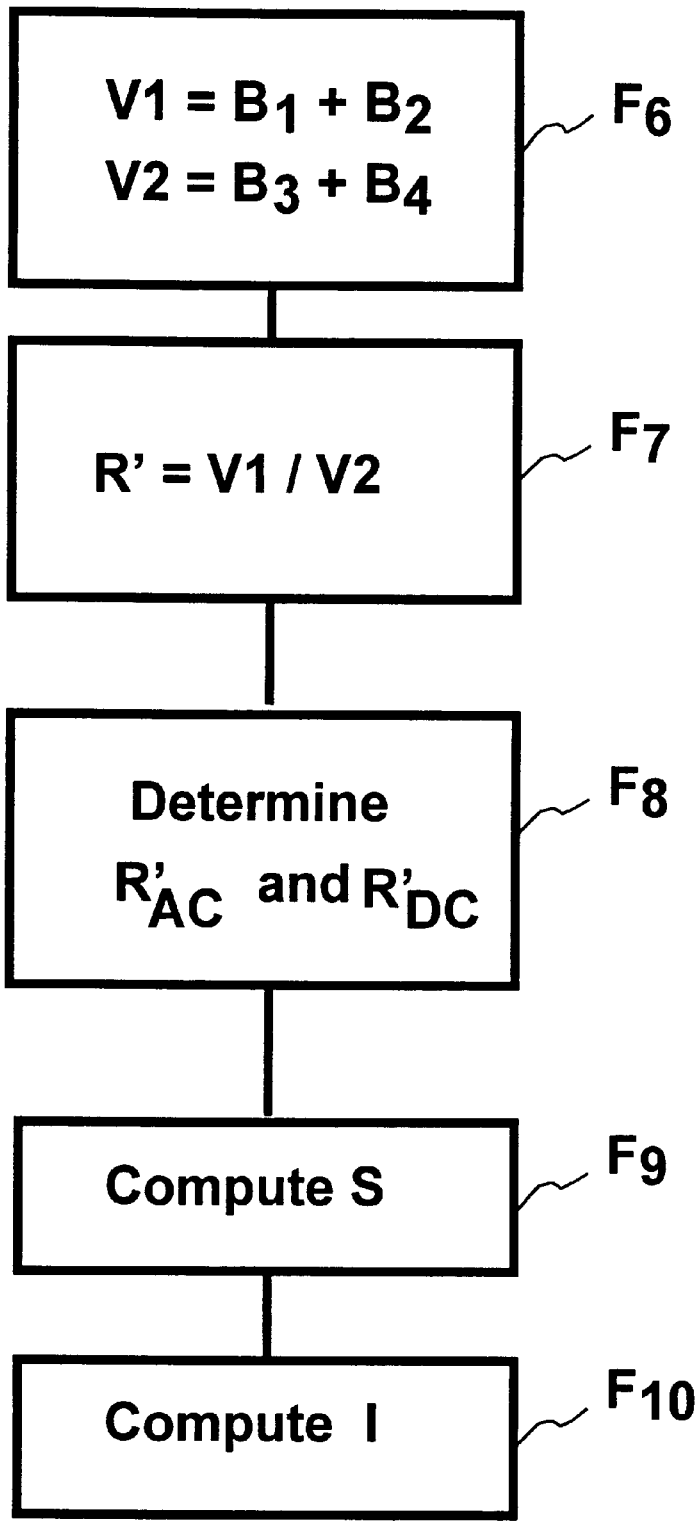

As represented in the flowchart of FIG. 6, the microprocessor 18 reconstitutes (step F6) signals V1 and V2 from the signals $B_1$ to $B_4$ and then uses the reconstituted signals to determine the current I to be measured. In step F6, the microprocessor computes the signals V1 and V2 according to the equations:

$$V1=B_1+B_2 \tag{16}$$

$$V2=B_3+B_4 \tag{17}$$

The microprocessor 18 then computes (step F7) the first quantity R'=V1/V2, then determines (step F8) the AC component $R'_{AC}$ and DC component $R'_{DC}$ of the first quantity.

It can be shown that, in this embodiment, with a first order approximation, the first quantity R' can be written:

$$R' \cong \frac{\eta_1 G_1 \alpha_1}{\eta_2 G_2 \alpha_2}(A + gB2VNI) \tag{18}$$

The ratio $S'=R'_{AC}/R'_{DC}$ can therefore be written:

$$S'=gB/A2VNI \tag{19}$$

From which the second quantity S=S'/g can be deduced. The microprocessor 18 computes (step F9) S' and the second quantity S, then (step F10) the current I to be measured.

The filters and amplifiers are chosen such that the filters and gains are the same on both the measuring channels. As an alternative embodiment, the signals can be multiplexed, using a single low-pass filter, a single high-pass filter and a single amplifier.

Figure 7:
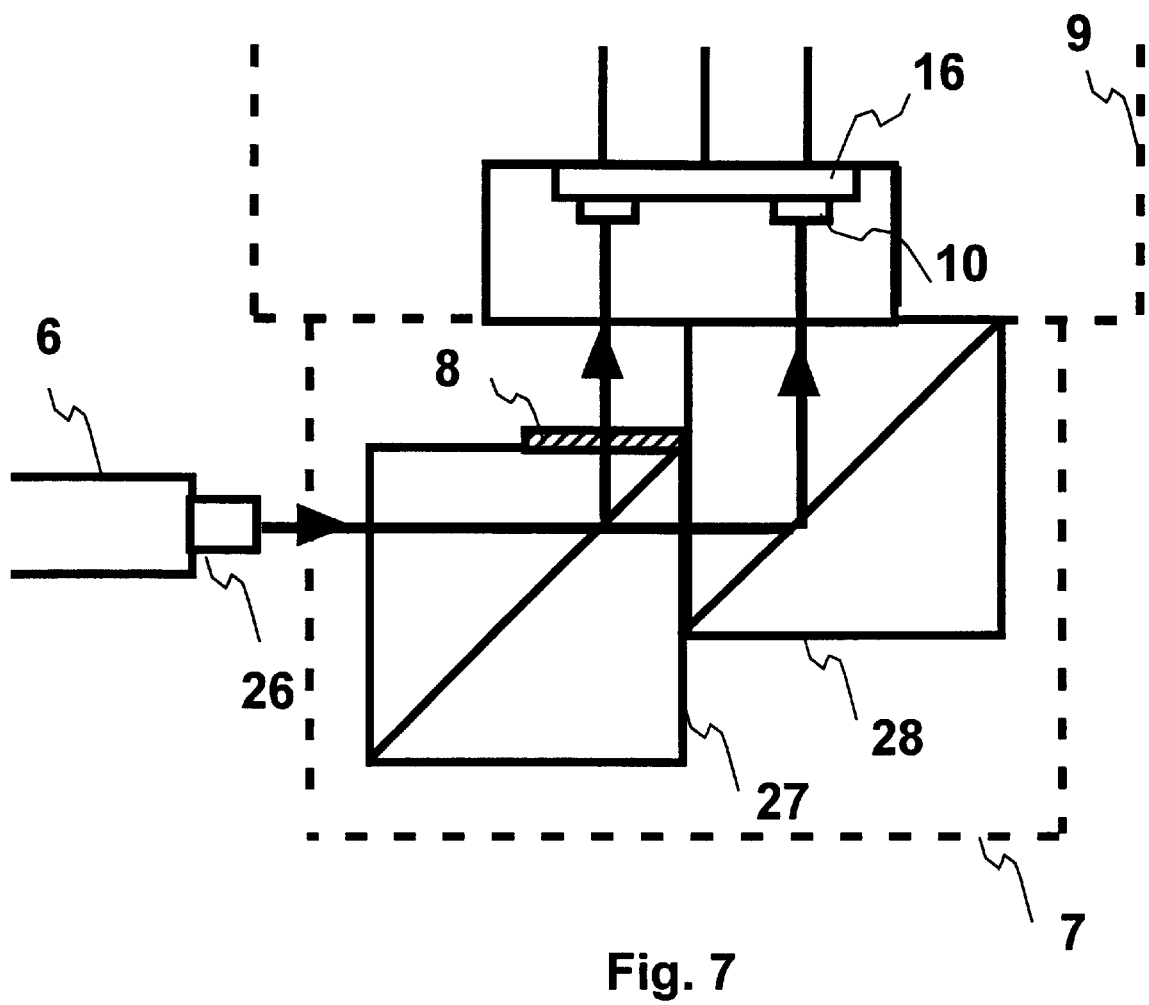
FIGS. 7 to 9 illustrate various embodiments of the beam separator of the device according to FIG. 1.

FIG. 7 represents a preferred embodiment of the beam separator 7, comprising non-polarizing cubes. The light beam output from the transducer 4 is conducted to the beam separator 7 by the optical fiber 6, the end of which fiber can be equipped with a collimator 26. The beam separator 7 is formed by two non-polarizing cubes with semi-reflecting prisms 27 and 28 arranged so as to be slightly offset from one another. The light beam output from the transducer 4 is divided into two beams by the first cube 27, one passing through the cube whereas the other is reflected by the diagonal of the cube 27. The arrangement and offset of the cubes 27 and 28 are such that one of the beams, constituting the first output beam, exits directly from the beam separator and passes through the output polarizer 8, which polarizer is preferably adjoined to the first cube 27, whereas the other beam is reflected by the diagonal of the second cube 28 to constitute the second output beam, which exits from the beam separator 7 parallel to the first output beam. In FIG. 7, the first output beam is formed by the beam reflected by the cube 27. In an alternative embodiment, the fiber 6 can be arranged in the continuation of the first output beam, which is then formed by the beam passing through the first cube 27, whereas the second output beam is then formed by the beam reflected by the two cubes 27 and 28. In the preferred embodiment represented in FIG. 7, the photodiodes 10 of the processing unit, mounted on a single semi-conductor substrate 16, are arranged in a housing adjoined to the second cube 27, so as to reduce the distance between the beam separator 7 and the processing unit 9 to the minimum.

Figure 8:
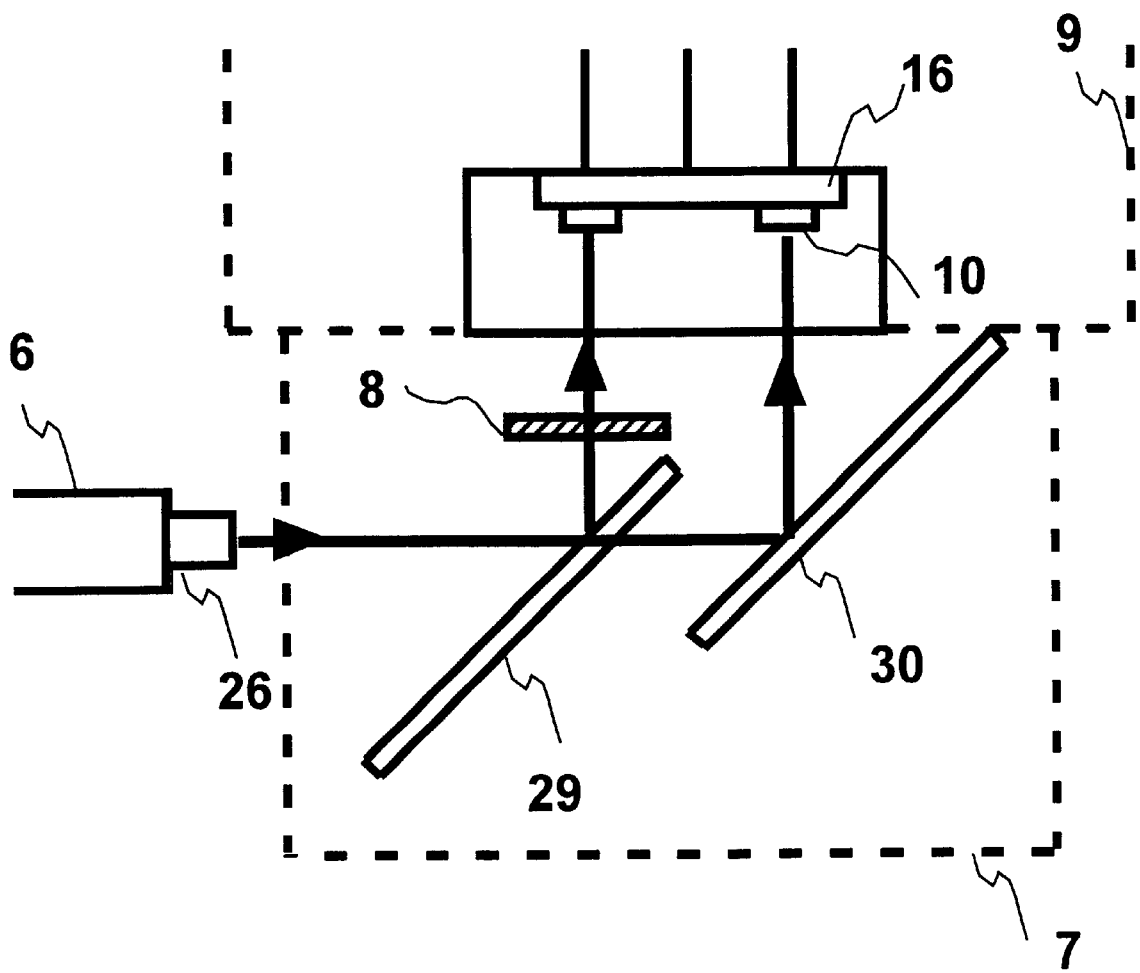

FIG. 8 represents an alternative embodiment of the beam separator 7, comprising separating blades 29 and 30.

Figure 9:
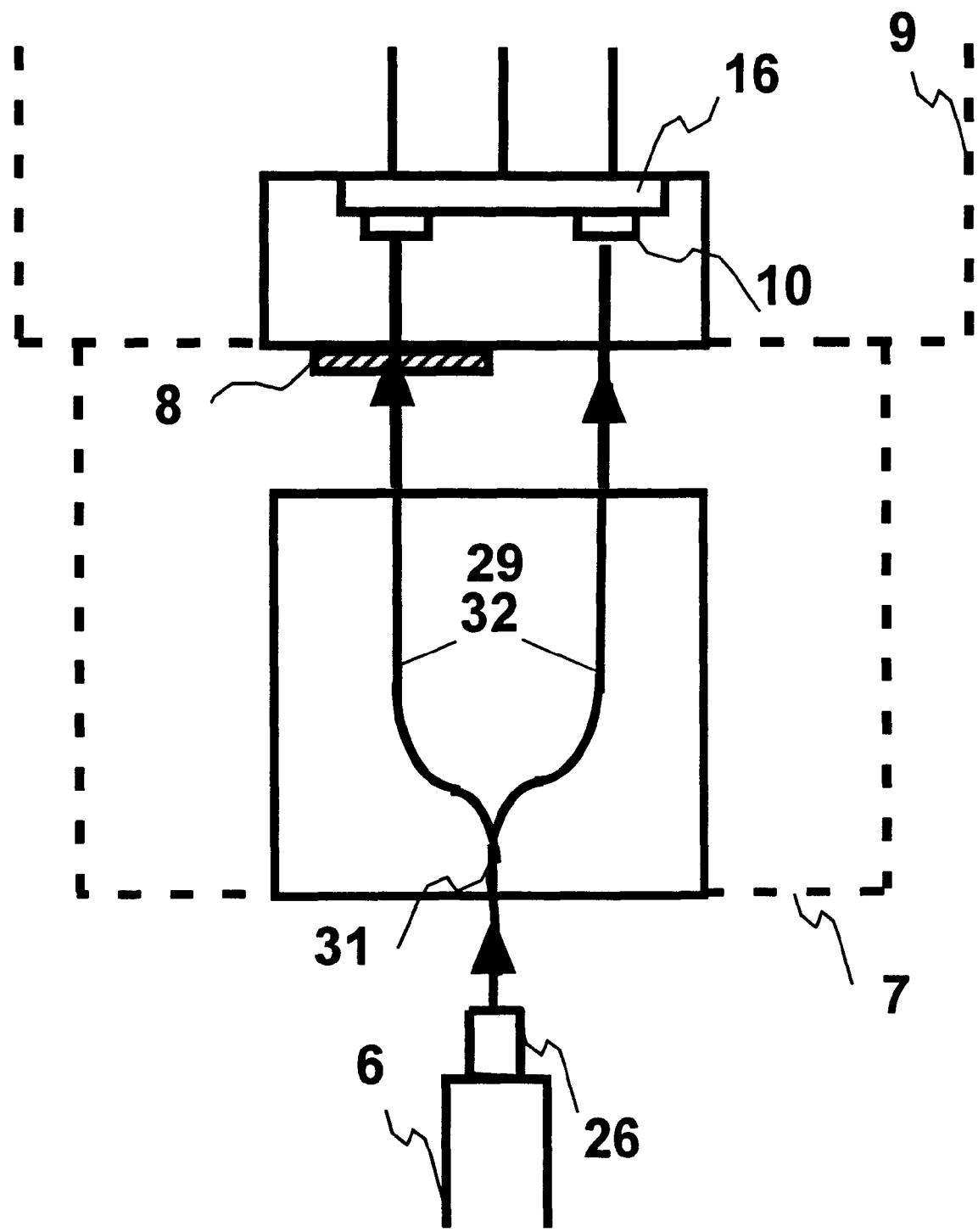

FIG. 9 represents another alternative embodiment of the beam separator 7, formed by an integrated optics element.

The light beam output from the transducer 4 is applied to the input of an input wave guide 31, is then divided into two beams by a Y-junction, and then passes in two output wave guides 32 formed on a single substrate. The distance between the output wave guides 32 is adjusted to the distance between the sensitive zones of the photodiodes 10. As in FIGS. 7 and 8, a polarizer 8 is inserted up-line from one of the photodiodes. To keep the information polarization-coded, the wave guides 31 and 32 are preferably guides, with no linear birefringence Alternatively, birefringent guides can be used, provided that the neutral birefringence axes of the polarization maintaining fiber 6 and of the input wave guide 31 are aligned.

The beam separator 7 could also be achieved simply by letting the output beam diverge freely on output from the transducer 4 or of the optical fiber 7 and placing the output polarizer 8 on a part only of the divergent beam.

To compensate the polarization noises in the optic fibers 3 and 6 with large birefringence, the fibers can be oriented so as to create pseudo-depolarizers, in known manner (EP-A-577,897). For this, the neutral axes of the fiber 3 (FIG. 1) are oriented 45° with respect to the polarization plane of the incident light beam supplied by the light source 1. This source is preferably formed by a multimode laser diode or a super light-emitting source. The neutral axes of the fiber 6 are preferably oriented 45° with respect to the polarization axis of the polarizer 2.

The invention is not limited to the particular embodiments described above. In particular the transducer 4 can be of any known type and be achieved using integrated optics.

What is claimed is:

1. A device for measuring an electric current by Faraday effect comprising:

a light source for supplying an incident light beam, an input polarizer for linearly polarizing the incident light beam, a magneto-optical transducer for receiving the polarized incident light beam, a beam separator located at the output of the transducer and for supplying first and second output light beams, an output polarizer located on the path of the first output light beam, a processing unit comprising a first optical input connected to the output of the output polarizer, a second optical input for receiving the second output light beam directly from the beam separator, and means for opto-electronic conversion connected to the first and second optical inputs to supply first and second electrical signals to computing means for digital computation of the current to be measured, wherein the computing means comprise means for computing a first quantity constituted by the ratio between the first and second electrical signals, means for determining the AC and DC components of the first quantity, means for computing a second quantity from the AC and DC components of the first quantity, and means for computing the current to be measured from the second quantity.

2. The device according to claim 1, wherein the second quantity is obtained by computing the ratio between the AC and DC components of the first quantity.

3. The device according to claim 1, wherein the second quantity S is obtained according to the equation:

$$S = \frac{R_{AC}}{1 + a(R_{DC} - 1)}$$

wherein $R_{AC}$ and $R_{DC}$ are respectively the AC and DC components of the first quantity and a is an adjustment coefficient.

4. The device according to claim 1, wherein the beam separator is located as close as possible to the processing unit.

5. The device according to claim 4, wherein the beam separator is connected to the transducer by a single-mode, polarization maintaining optical fiber.

6. The device according to claim 1, wherein the means for opto-electronic conversion comprise two photodiodes located on a single semi-conductor substrate and associated respectively to the first and second optical inputs of the processing unit, two amplifiers located on a single semi-conductor substrate being connected on output of the photodiodes.

7. The device according to claim 1, wherein the beam separator comprises non-polarizing cubes.

8. The device according to claim 1, wherein the beam separator comprises separating blades.

9. The device according to claim 1, wherein the beam separator comprises integrated optics elements.

10. The device according to claim 1, wherein the means for opto-electronic conversion comprise first and second photodiodes connected to the first and second optical inputs of the processing unit, the processing unit comprising first and second amplifiers respectively connected to the outputs of the first and second photodiodes, means for determining the DC component of the output signals of one of said amplifiers, means for determining a first difference between the output signals of the first amplifier and of the means for determining the DC component of the output signals of one of said amplifiers, means for determining a second difference between the output signals of the second amplifier and of the means for determining the DC component of the output signals of one of said amplifiers, the outputs of the means for determining the DC component of the output signals of one of said amplifiers and of the means for determining the first and second differences being connected to inputs of an electronic digital processing circuit comprising means for reconstituting, from the signals applied to its inputs, the first and second electrical signals used by the means for computing the first quantity, the processing unit comprising amplifiers of preset gain connected between the means for the first and second differences and the associated inputs of the electronic digital processing circuit, the first and second electrical signals Ui, with i=1 or 2, used by the means for computing the first quantity being determined according to the equation:

$$U_i = (A_i/g) + A_3$$

with i=1,2 and wherein $A_1$, $A_2$ and $A_3$ are respectively the signals applied to the inputs of the electronic digital processing circuit.

11. The device according to claim 1, wherein the means for opto-electronic conversion comprise first and second photodiodes connected to the first and second optical inputs of the processing unit, the processing unit comprising first and second amplifiers respectively connected to the outputs of the first and second photodiodes, means for determining the DC components of the output signals of said amplifiers, means for determining the AC components of the output signals of said amplifiers, the outputs of the means for determining the DC and AC components of the output signals of said amplifiers being connected to inputs of an electronic digital processing circuit comprising means for reconstituting, from the signals applied to its inputs, electrical signals used by the means for computing the first quantity, the processing unit comprising amplifiers of preset gain, connected between the means for determining the AC components and the associated inputs of the electronic digital processing circuit, the electrical signals V1 and V2 used by the means for computing the first quantity being determined according to the equations:

$$V1 = B_1 + B_2$$

$$V2 = B_3 + B_4$$

wherein $B_1$, $B_2$, $B_3$ and $B_4$ are respectively the signals applied to the inputs of the electronic digital processing circuit.

* * * * *